United States Patent [19]
Trimberger et al.

[11] Patent Number: 5,815,004
[45] Date of Patent: Sep. 29, 1998

[54] MULTI-BUFFERED CONFIGURABLE LOGIC BLOCK OUTPUT LINES IN A FIELD PROGRAMMABLE GATE ARRAY

[75] Inventors: Stephen M. Trimberger; Khue Duong, both of San Jose, Calif.

[73] Assignee: Xilinx, Inc., San Jose, Calif.

[21] Appl. No.: 543,591

[22] Filed: Oct. 16, 1995

[51] Int. Cl.$^6$ .......................... H03K 7/38; H03K 19/177
[52] U.S. Cl. ................................................ 326/41; 326/39
[58] Field of Search ........................................ 326/39, 41

[56] References Cited

U.S. PATENT DOCUMENTS

| | | | |
|---|---|---|---|
| 5,089,973 | 2/1992 | Furtek | 326/39 |
| 5,111,079 | 5/1992 | Steele | 326/39 |
| 5,319,255 | 6/1994 | Garverick et al. | 326/39 |
| 5,469,003 | 11/1995 | Kean | 326/39 |
| 5,498,975 | 3/1996 | Cliff et al. | 326/39 |
| 5,517,132 | 5/1996 | Ohara | 326/41 |
| 5,600,263 | 2/1997 | Trimberger et al. | 326/41 |

OTHER PUBLICATIONS

Babb, Jonathan; Tessier, Russell; and Agarwal, Anant, "Virtual Wires: Overcoming Pin Limitations in FPGA–based Logic Emulators", IEEE Workshop on FPGAs for Custom Computing Machines, FCCM 93, Apr. 5–7, 1993, pp. 1–15.

*Primary Examiner*—Edward P. Westin
*Assistant Examiner*—Richard Roseen
*Attorney, Agent, or Firm*—Anthony C. Murabito (Wagner Murabito and Hao); Jeanette S. Harms

[57] ABSTRACT

A field programmable gate array having independently buffered output lines of a CLB for handling critical path situations. One of the CLB's output ports is coupled to a vertical interconnect line and a horizontal interconnect line. Two separate buffers are used to drive these lines. One buffer drives the horizontal interconnect line, while the other drives the vertical interconnect line. One of these lines is used to conduct the output signal that corresponds to the critical path. The other line is used to conduct the output signal onto other branches that are not part of the critical path. Hence, by using a separate buffer to drive the critical path, it is not loaded with the circuits associated with the non-critical branches.

21 Claims, 7 Drawing Sheets

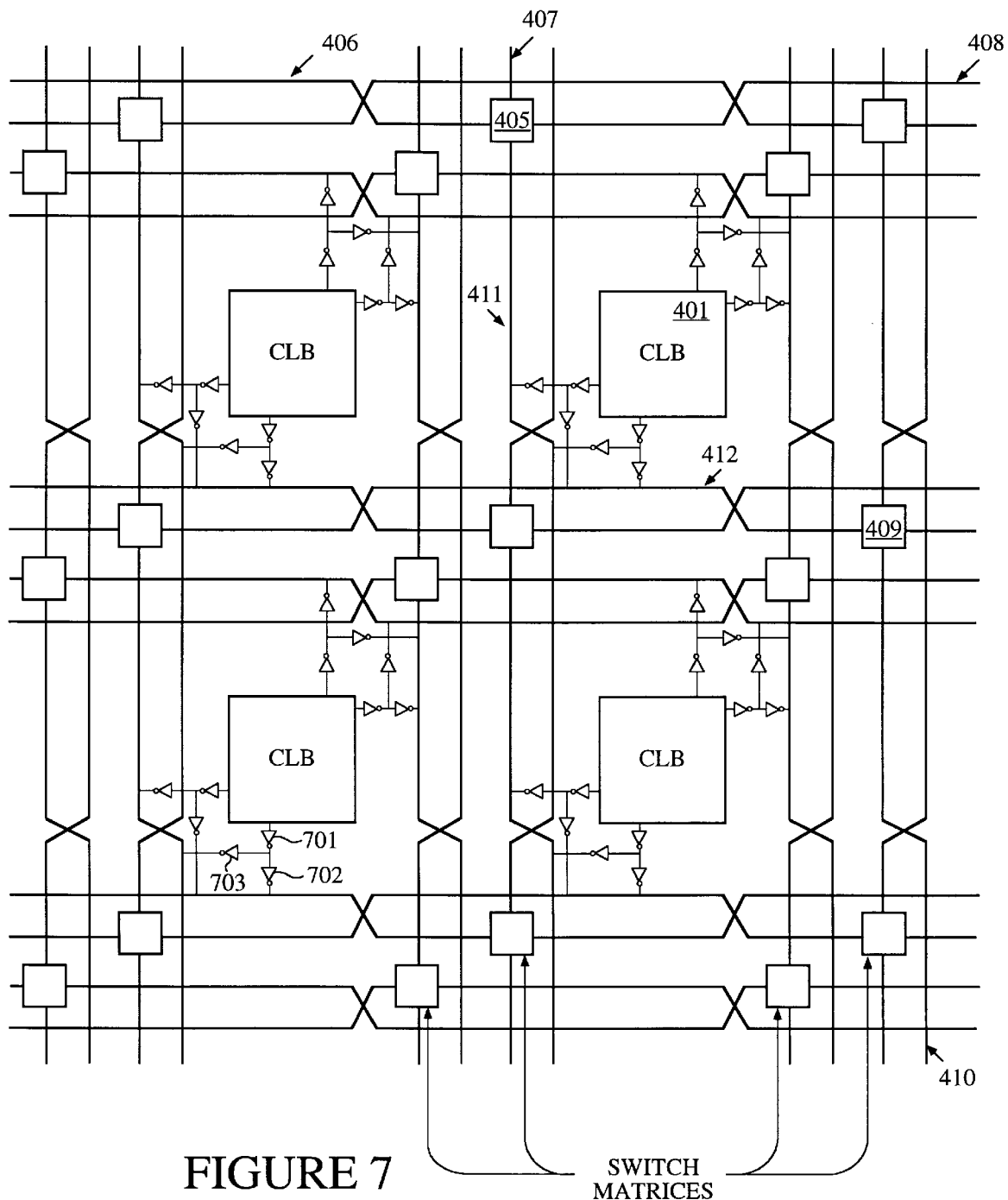
FIGURE 7  SWITCH MATRICES

MULTI-BUFFERED CONFIGURABLE LOGIC BLOCK OUTPUT LINES IN A FIELD PROGRAMMABLE GATE ARRAY

FIELD OF THE INVENTION

The present invention pertains to buffering the output lines of a configurable logic block in a field programmable gate array in a manner that allows critical signals to be routed more quickly to their destinations.

BACKGROUND OF THE INVENTION

Integrated circuit (IC) semiconductor chips are the critical components found in virtually all modern telecommunications, computer, and electronics products. Many of these semiconductor chips are custom-made and tailored to the exact specifications supplied by the designers. However, these dedicated custom chips can be quite expensive to produce. Hence, they are not ideally suited for those instances where only a limited quantity of chips are desired. Furthermore, it can take quite a long time to fabricate these custom chips. In today's competitive environment, time-to-market is of utmost importance. Crucial market share might be irretrievably lost while a company waits for its custom chips to be produced and delivered. And if there is an error somewhere in the initial design or layout, more delays are incurred in fixing the problems.

In response to the shortcomings inherent to custom IC chips, field-programmable gate arrays (FPGAs) were developed. An FPGA is a standard off-the-shelf semiconductor chip that can be individually programmed to perform the desired functions. They can be reprogrammed an unlimited number of times and can be used in innovative designs where hardware is changed dynamically, or where hardware must be adapted to different user applications.

An FPGA is typically comprised of three major configurable elements: configurable logic blocks (CLBs), input/output blocks (IOBs), and interconnections. The CLBs provide the functional elements for constructing the desired logic. The IOBs provide the interface between the package pins and internal signal lines. The interconnections, typically comprising of a number of horizontal and vertical metal lines, provide routing paths to provide the input and output signals of the CLBs and IOBs onto the appropriate networks.

At the intersection of certain horizontal and vertical metal lines, a programmable interconnect point (PIP) is used to programmably route an electrical signal between these two lines. In addition, switch matrices are commonly used to provide for more flexibility in routing signals. The desired circuit design is established by programming internal memory cells to control the logic functions of the CLBs, PIPs, and switch matrices in order to produce the desired results.

FIG. 1 illustrates a CLB 101 connected to switch matrices 102–105 by single-length lines. CLB 101 receives a number of input signals on lines 106–117. The "K" line 118 is used to provide a clocking signal to CLB 101. CLB 101 outputs its signals onto output lines 119–122. Buffers 123–126, provided on output lines 119–122, buffer and drive the output signals. PIPs, shown as black dots, are placed at strategic intersections between vertical and horizontal single-length lines. These PIPs can be programmed to couple signals between CLB 101 and any of the switch matrices 102–105. Switch matrices 102–105 are used to route signals between CLB 101 and other CLBs or IOBs.

Typically, an output signal from CLB 101 is routed to several different destinations. This high fan-out drags down all of the signal paths because a single buffer must now drive a whole host of interconnect lines and PIPs. Furthermore, a buffer might be required to drive the output signal very long distances. The result is that the heavily loaded buffer does not have the capability of properly driving the output signal. Hence, the speed at which the signal is routed to its destination is detrimentally impacted. A slower signal transmission on most of the signal paths does not significantly impact the overall speed of the chip. However, if one of the branches happens to be that of a critical path, then the chip's speed could be severely affected.

One solution to this problem is to implement a larger buffer having a greater drive capability. However, since there are so many buffers within an FPGA, increasing the sizes of these buffers would cause the die size to proportionally increase. A larger die size directly translates into increased costs because less dies (i.e., chips) can be fabricated out of a given wafer. Besides which, a more powerful buffer is not needed in many of the designs. Another solution has been to use another CLB to drive the critical path signal. However, there are only a limited number of CLBs per FPGA. Consuming an I/O port on a CLB just for the sake of increased drive is very wasteful and inefficient. Thus, there is a need in the prior art for an interconnection scheme in an FPGA that efficiently isolates the critical path from non-critical paths and properly drives the critical path.

SUMMARY OF THE INVENTION

The present invention pertains to a field programmable gate array having independently buffered output lines of a CLB for handling critical path situations. The field programmable gate array is comprised of an array of configurable logic blocks that are used to perform logic functions. A number of horizontal and vertical interconnect lines, programmable intersection points, and switch matrices are used to route signals between the CLBs. The output ports of the CLBs have a vertical interconnect line and a horizontal interconnect line. Two separate buffers are used to drive these lines. One buffer drives the horizontal interconnect line, while the other drives the vertical interconnect line. Thereby, an output signal can be routed to many different destinations. However, if one of the routes corresponds to a critical path, the FPGA is programmed so that one of the horizontal or vertical interconnect line is dedicated to the critical path. The buffer associated with that interconnect line solely drives the output signal corresponding to the critical path. The other interconnect line is used to conduct the output signal onto the other branches that are not part of the critical path. Hence, by using a separate buffer to drive the critical path, it is not loaded with the circuitry associated with the non-critical branches.

BRIEF DESCRIPTION OF THE DRAWINGS

The present invention is illustrated by way of example, and not by way of limitation, in the figures of the accompanying drawings and in which like reference numerals refer to similar elements and in which:

FIG. 7 shows a CLB connected and buffered to the adjacent double-length lines and switch matrices in accordance with another embodiment of the present invention.

DETAILED DESCRIPTION OF THE DRAWINGS

Figure 1:
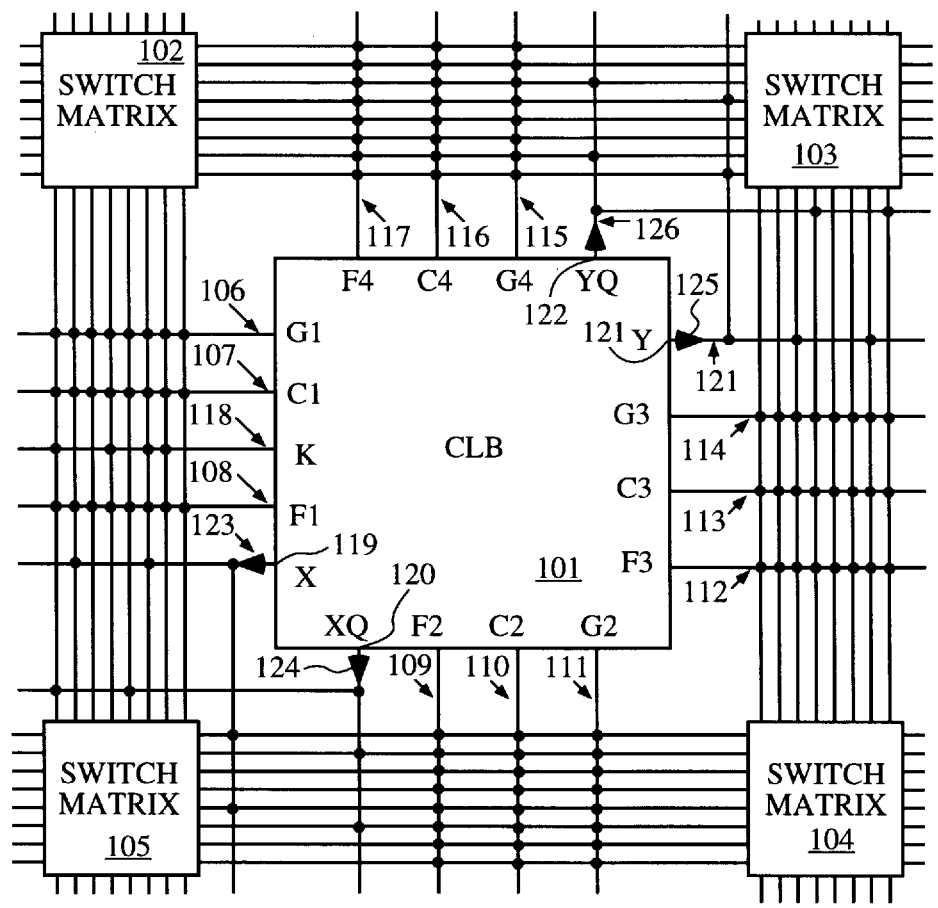
FIG. 1 illustrates a prior art CLB connected to switch matrices by single-length lines.
Figure 2:
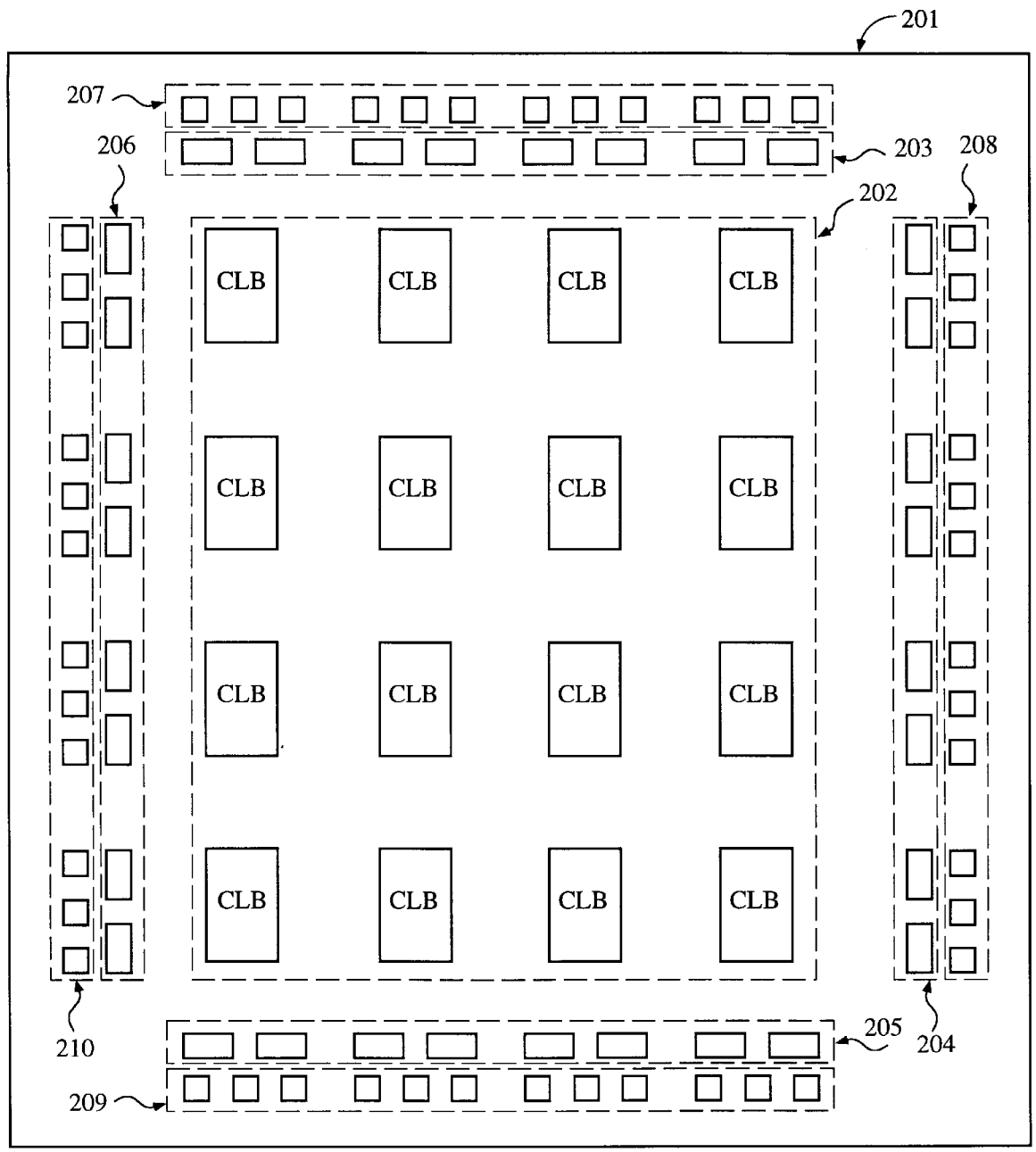
FIG. 2 shows a block diagram of an FPGA layout.

FIG. 2 illustrates an FPGA 201 including a 4×4 CLB array 202. However, an FPGA design can have an 8×8, 10×10, 12×12, 14×14, 16×16, 18×18, 20×20, 24×24, 28×28, 32×32, etc. CLB matrix. Consequently, there may be as few as 16 or as many as 1,024 plus CLBs contained within an FPGA chip. The present invention can be applied to suit any CLB matrix size. A CLB can be comprised of different elements including function generators, flip-flops, buffers, drivers, multiplexers, registers, etc. The present invention can be applied equally to any kind of CLB configuration. Surrounding CLB array 202 are IOBs 203–206 and decoders 207–210.

In one embodiment of the present invention, the CLBs, IOBs, and decoders are programmably interconnected by the use of three main types of interconnect lines. These interconnect lines are distinguished by the relative length of their segments: single-length lines, double-length lines, and longlines. The single-length lines are comprised of a grid of horizontal and vertical metal lines that intersect at a switch matrix between each CLB. The switch matrix consists of programmable transistors used to establish connections between the single-length lines. The double-length lines consist of a grid of metal segments that are twice as long as the single-length lines. Hence, a double-length line runs past two CLBs before entering a switch matrix. Longlines form a grid of metal interconnect segments that run the length or width of an array and are used to carry signals at greater distances.

Figure 3:
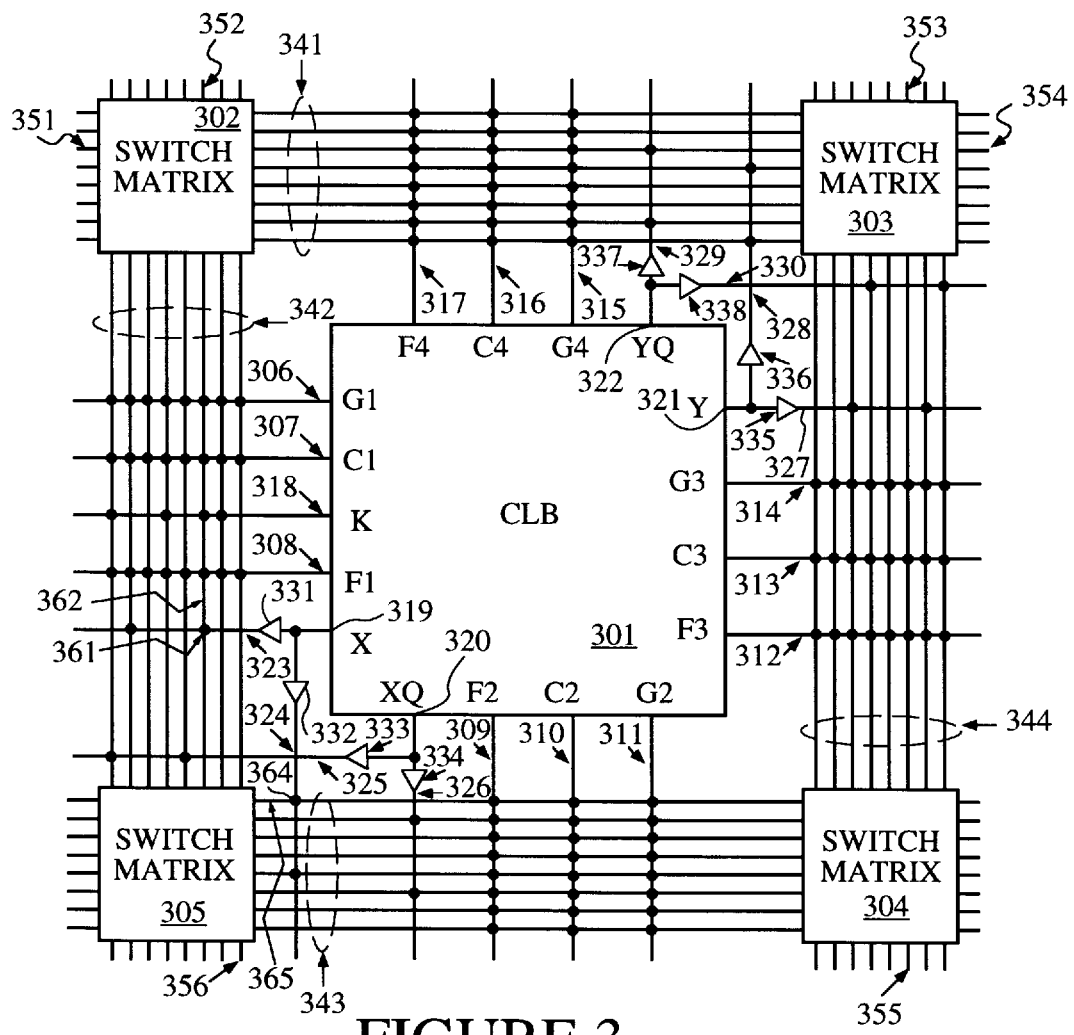
FIG. 3 illustrates a CLB connected and buffered to the adjacent single-length lines and switch matrices in accordance with the present invention.

FIG. 3 shows a circuit diagram of a CLB 301 connected and buffered to the adjacent single-length lines and switch matrices in accordance with the present invention. CLB 301 includes twelve input ports (F1–F4, G1–G4, and C1–C4), a clock port (K), and four output ports (X, XQ, Y, and YQ). Input ports F1–F4 are used to input signals to a first function generator (not shown); input ports G1–G4 are used to input signals to a second function generator (not shown); and input ports C1–C4 serve to input control signals for controlling CLB 301. These twelve input signals are transmitted to CLB 301 via lines 306–317. The clock signal is transmitted via line 318. The four output ports X, XQ, Y, and YQ, are connected to single-length lines 319–322. These seventeen I/O and clock lines 306–322 intersect sets of horizontal and vertical lines 341–344 that are coupled to switch matrices 302–305. Each switch matrix 302–305 consists of programmable n-channel pass transistors used to establish connections between the single-length lines. For example a signal entering on the right side of a switch matrix can be routed to a single-length line on the top, left, or bottom sides. Moreover, the switch matrix can also route the signal to any combination thereof, if multiple branches are required. Numerous PIPs (represented by the black dots) are used to electrically connect a vertical line to a horizontal line or vice versa.

For each of the lines 310–322 coupled to the output ports of CLB 301, there are multiple buffers which are used to drive the corresponding output signals. For example, the X output signal on line 319 is driven by buffers 331 and 332. Buffer 331 drives the X output signal onto horizontal line 323, whereas buffer 332 drives the X output signal onto vertical line 324. Likewise, the XQ output signal on line 320 is driven onto lines 325 and 326 by buffers 333 and 334, respectively. For the Y output signal, buffer 335 drives the signal onto a horizontal line 327, and buffer 336 drives the signal onto a vertical line 328. Two buffers 337 and 338 are used to drive the YQ output signal onto lines 329 and 330, respectively. Although FIG. 3 shows only two buffers driving an output signal from each output port, the present invention also covers the cases where more than two buffers, placed at different interconnect locations, are used to drive the same output signal.

By using more than one buffer to drive an input or output signal, a critical path connection can be driven by its own dedicated buffer, while another buffer is used to drive the signal to all of the other connections associated with that output signal. A critical path relates to the route corresponding to a signal which has one of the tightest timing constraints. Using more than one buffer for driving a given input or output signal also serves the function of isolating one or more signal paths from the other signal paths.

For example, suppose that the X output signal is to be routed to six different branches 351–356. And suppose that one of these six branches, branch 356, corresponds to a critical path, whereas the other five branches 351–355 correspond to non-critical paths. Driver 331 is used to drive the X output signal to all of the non-critical paths 351–355 by programming PIP 361 to electrically connect horizontal line 323 to a vertical line 362. Switch matrix 302 is programmed to route the X output signal on line 362 to lines 351 and 352 and to switch matrix 303. Switch matrix 303 is programmed to route the X output signal to lines 353 and 354 and to switch matrix 304. Switch matrix 304 is programmed to route the X output signal to line 355. Meanwhile, driver 332 drives only the single critical path branch 356 through PIP 364, onto a horizontal line 365, through switch matrix 305, and then to vertical line 356. Hence, critical path 356 is not unduly slowed down by the load associated with the non-critical paths 351–355. Furthermore, critical path 356 is also isolated from the other non-critical paths 351–355.

Figure 4:
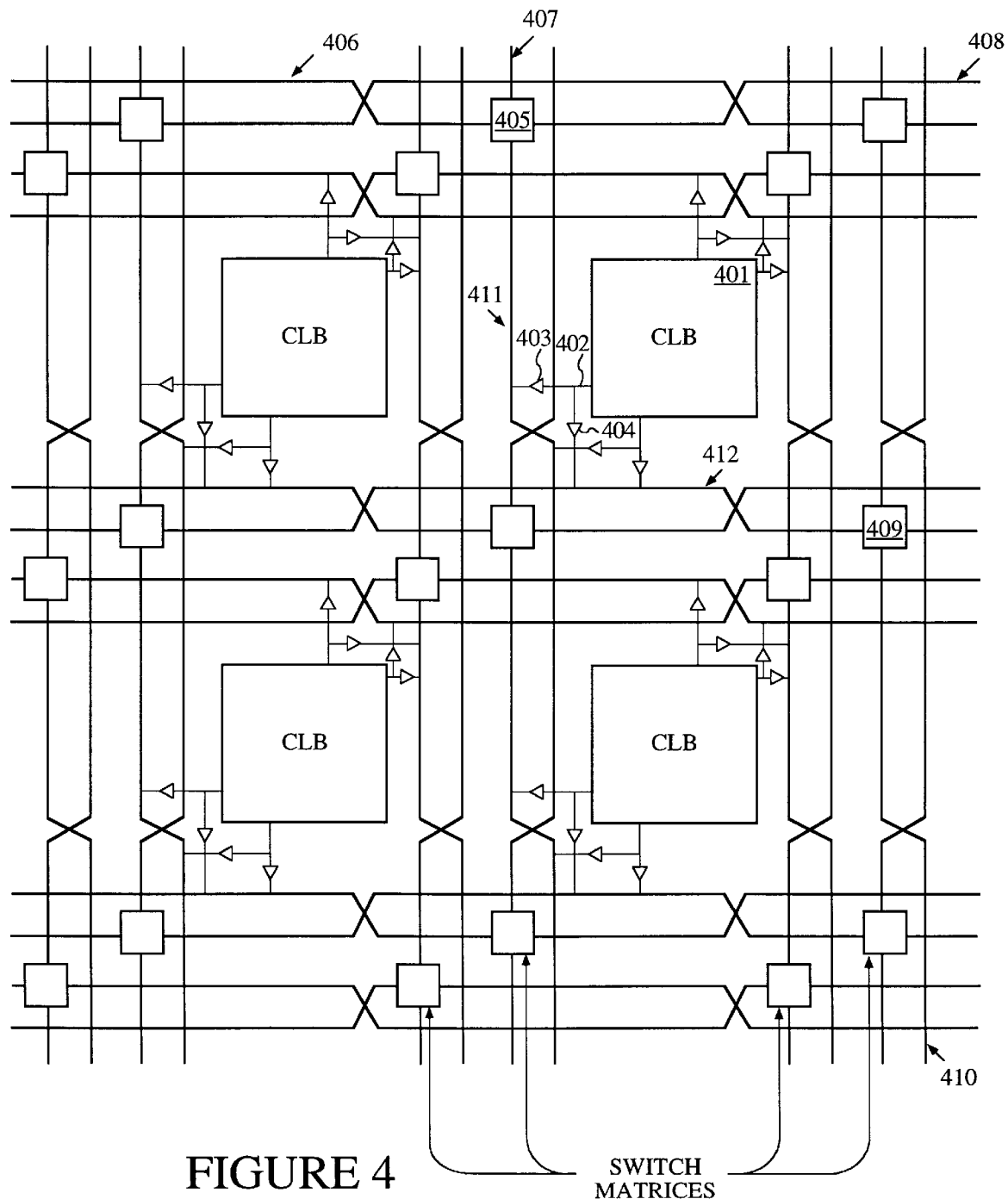
FIG. 4 shows a CLB connected and buffered to the adjacent double-length lines and switch matrices in accordance with the present invention.

FIG. 4 shows a CLB 401 connected and buffered to the adjacent double-length lines and switch matrices. As described previously, a double-length line runs past two CLBs before entering a switch matrix. Double-length lines are grouped in pairs with the switch matrices staggered so that each line goes through a switch matrix at every other CLB location in that row or column. As with the single-length lines, all the CLB input signals except K, can be driven from any adjacent double-length line. Furthermore, each CLB output signal can drive nearby double-length lines in both the vertical and horizontal planes. These double-length lines provide efficient routing for intermediate length, point-to-point interconnections. In accordance with the present invention, dual buffers are associated with each of the output lines from the CLBs.

For example, an output signal on line 402 of CLB 401 can be driven by buffer 403 onto line 411 to switch matrix 405. A user can program switch matrix 405 to provide the output signal onto branches 406–408. At the same time, driver 404 can be used to drive the output signal onto critical path 410 via line 412 and switch matrix 409. In another embodiment of the present invention shown in FIG. 7, the buffering is provided by three inverters, 701, 702, and 703. In this configuration, an output signal is inverted twice before being transferred to the appropriate switch matrix 405. It should be noted that in other embodiments not every CLB output line is doubly buffered. Furthermore, there might be instances wherein a CLB might have more than two independently buffered interconnect lines corresponding to one of its output ports. The present invention encompasses many different types of interconnect/buffer combinations and configurations.

The present invention of using multi-buffered signal paths is also applicable to longlines. As discussed previously, horizontal and vertical longlines can span the entire width or height of the chip. Longlines bypass the switch matrices and are intended primarily for signals that must travel a long distance, or must have minimum skew among multiple destinations. Furthermore, the present invention of using multi-buffered signal paths is also applicable to IOB output lines as well as CLB output lines.

Figure 5:
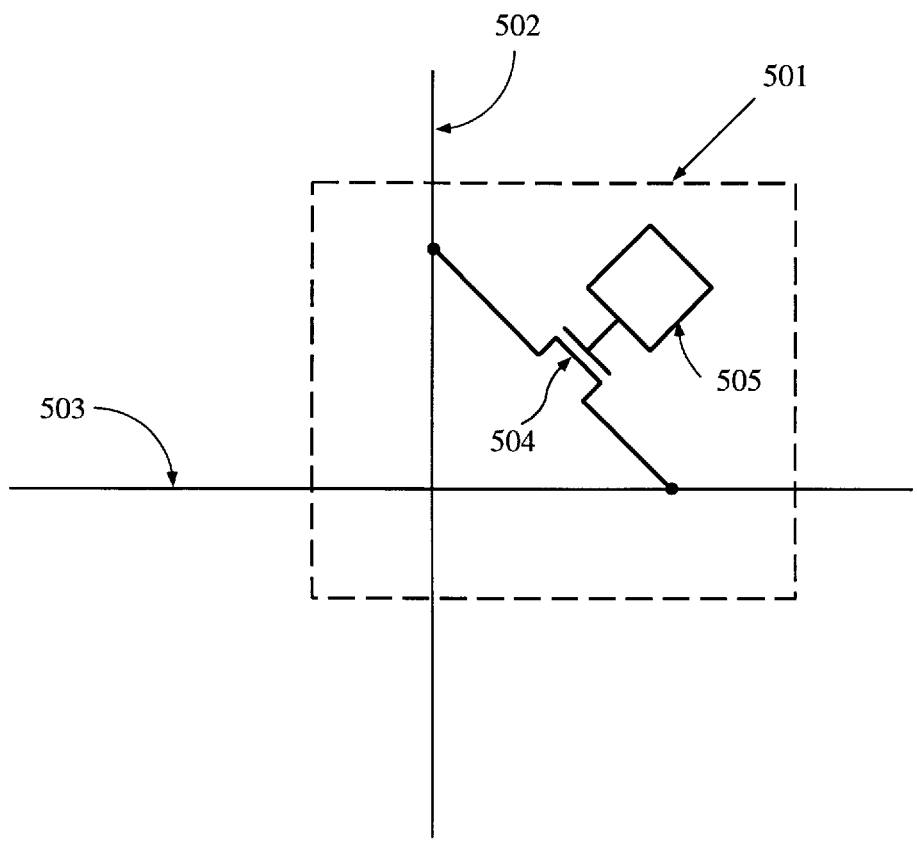
FIG. 5 shows a circuit that may be used as a programmable interconnect point.

FIG. 5 shows a circuit that may be used as a programmable interconnect point (PIP). PIP 501 is comprised of a pass transistor 504 having its gate coupled to a programmable memory cell 505. Memory cell 505 can be programmed to contain information that either turns on or turns off transistor 504. In this arrangement, PIP 501 can selectively connect line 502 to line 503. Specifically, if turned or programmed ON, transistor 504 electrically connects lines 502 and 503. Otherwise, these lines are not connected together by PIP 30.

Figure 6A:
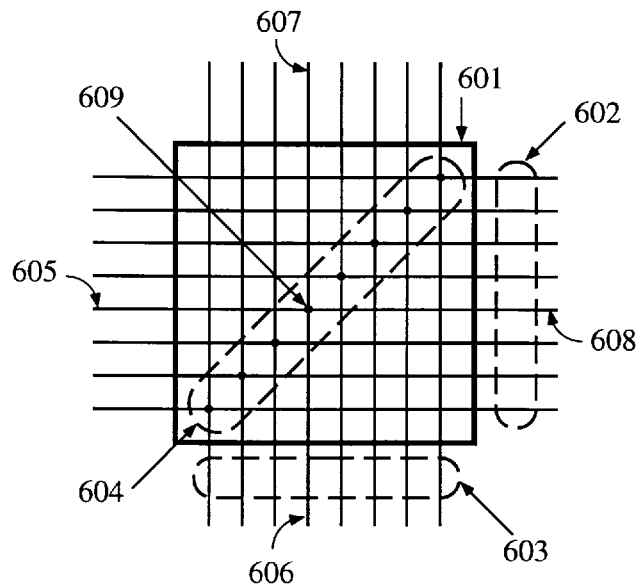
FIG. 6A shows a circuit diagram of a switch matrix.

FIG. 6A shows a circuit diagram of a switch matrix 601 which programmably couples eight horizontal lines 602 to eight vertical lines 603. In other words, any of the horizontal lines 602 can be either electrically connected to or disconnected from selected vertical lines 603, as programmed by the user. The way in which a connection is established or disconnected is by controlling the eight PIPs 604.

Figure 6B:
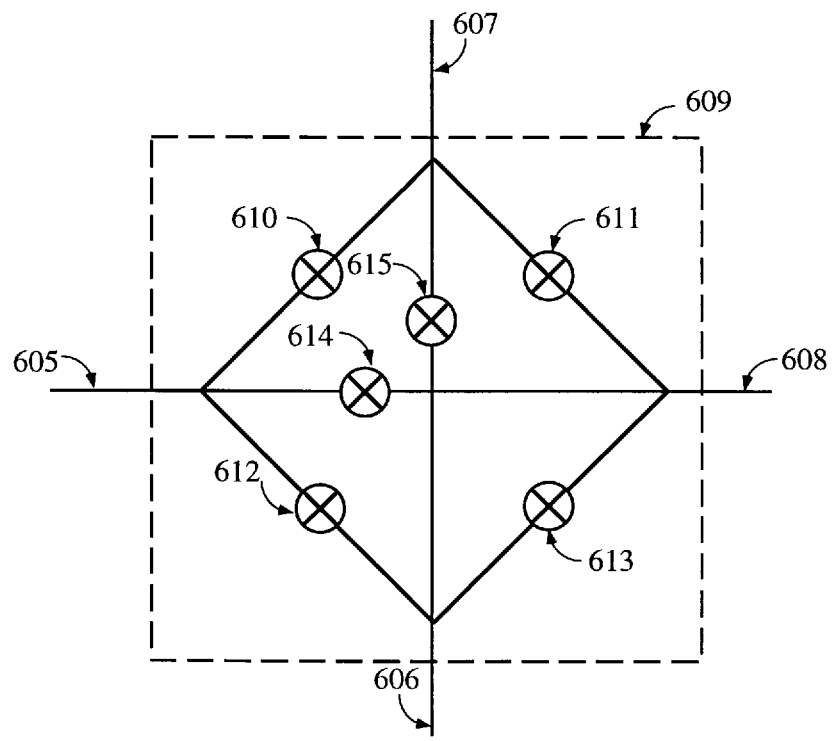
FIG. 6B shows a detailed circuit of a sample programmable interconnect point associated with a switch matrix.

FIG. 6B shows a detailed circuit of a sample programmable interconnect point associated with a switch matrix. The interconnect point 609 is comprised of six pass transistors 610–615. Each of these six pass transistors can be programmed to either be either conducting or non-conducting. For example, a signal on horizontal line 605 can be routed onto vertical line 606 by programming pass transistor 612 to be conducting and pass transistors 610–611 and 613–615 to be non-conducting. The signal being conducted is thereby kept off of lines 607 and 608. The signal on line 608 can be routed to line 605 by turning on pass transistor 614 and turning off all of the other pass transistors.

A multi-buffered CLB output line for use in a field programmable gate array has been described. The foregoing descriptions of specific embodiments of the present invention have been presented for purposes of illustration and description. They are not intended to be exhaustive or to limit the invention to the precise forms disclosed. Those skilled in the art will recognize modifications and variations that are possible in light of the above teaching. The embodiments were chosen and described in order to best explain the principles of the invention and its practical application, to thereby enable others skilled in the art to best utilize the invention. It is intended that the scope of the invention be defined only by the claims appended hereto and their equivalents.

What is claimed is:

1. An output driver configuration for a logic block comprising:
   a first buffer coupled to an output port of the logic block for driving an output signal;
   a second buffer coupled to the output port of the logic block for driving the output signal;
   a first output line coupled to the first buffer;
   means for programmably coupling the first output line to one of a critical interconnect path and a non-critical interconnect path for the output signal;
   a second output line coupled to the second buffer; and
   means for programmably coupling the second output line to one of a critical interconnect path and a non-critical interconnect path for the output signal.

2. The output driver configuration of claim 1, wherein the means for programmably coupling the first output line includes:
   a third line; and
   a programmable interconnect point coupled to the third line and the first output line, wherein the programmable interconnect point selectively provides the output signal from the first output line to at least the third line.

3. The output driver configuration of claim 1, wherein the means for programmably coupling the second output line includes:
   a third line; and
   a programmable interconnect point coupled to the third line and the second output line, wherein the programmable interconnect point selectively provides the output signal from the second output line to at least the third line.

4. The output driver configuration of claim 1, wherein the means for programmably coupling includes a switch matrix coupled to a plurality of interconnect lines, wherein the switch matrix programmably routes the output signal to one or more of the plurality of interconnect lines.

5. The output driver configuration of claim 1, wherein the first output line and the second output line are single-length lines.

6. The output driver configuration of claim 1, wherein the first output line and the second output line are double-length lines.

7. The output driver configuration of claim 1, wherein the first output line and the second output line are longlines.

8. The output driver configuration of claim 1, wherein the logic block is a configurable logic block.

9. The output driver configuration of claim 1, wherein the logic block is an input/output block.

10. A programmable logic device comprising:
    a logic block including an input port for receiving an input signal, means for processing the input signal, and an output port for providing an output signal;
    an interconnect structure for programmably interconnecting the logic block to other portions of the programmable logic device, the interconnect structure including:
       a plurality of horizontal interconnect lines;
       a plurality of vertical interconnect lines; and
       a plurality of switch matrices located at some of the intersections of the horizontal and vertical interconnect lines for programmable coupling certain horizontal and vertical interconnect lines,
    a first interconnect line programmably coupled to the output port, wherein the first interconnect line becomes part of one of a critical path and a non-critical path;
    a first buffer coupled between the output port and the first interconnect line for driving the output signal on the first interconnect line;
    a second interconnect line programmably coupled to the output port, wherein the second interconnect line becomes part of one of a critical path and a non-critical path; and a second buffer coupled between the output port and the second interconnect line for driving the output signal on the second interconnect line.

11. The programmable logic device of claim 10, wherein the first interconnect line and the second interconnect line are single-length lines.

12. The programmable logic device of claim 10, wherein the first interconnect line and the second interconnect line are double-length lines.

13. The programmable logic device of claim 10, wherein the first interconnect line and the second interconnect line are longlines.

14. The programmable logic device of claim 10, wherein the logic block is a configurable logic block.

15. The programmable logic device of claim 10, wherein the logic block is an input/output block.

16. In a programmable logic chip, a method of isolating a critical path that conducts a logic block output signal from non-critical paths upon which the output signal is conducted, the method comprising the steps of:

driving the output signal onto a first line by a first buffer;

programmably routing the output signal from the first line onto a plurality of interconnect lines, wherein the first line forms part of the non-critical paths;

driving the output signal onto a second line by a second buffer; and programmably routing the output signal from the second line onto an interconnect line, wherein the second line forms part of the critical path, and wherein the second buffer is not loaded with the first line and the plurality of interconnect lines.

17. The method of claim 16, wherein an output port of the logic block is coupled to an input terminal of the first buffer and to an input terminal of the second buffer.

18. The method of claim 17, wherein the first line and the second line include single-length lines.

19. The method of claim 17, wherein the first line and the second line include double-length lines.

20. The method of claim 17, wherein the first line and the second line include longlines.

21. The output driver configuration of claim 1, wherein the first buffer includes a first inverter and a second inverter coupled in series, and wherein the second buffer includes the first inverter and a third inverter coupled in series.

* * * * *